United States Patent
Toujo (10) Patent No.: US 10,284,164 B2
(45) Date of Patent: May 7, 2019

(54) CIRCUIT SUBSTRATE, FILTER CIRCUIT, AND CAPACITANCE ELEMENT

(71) Applicant: Murata Manufacturing Co., Ltd., Nagaokakyo-shi, Kyoto-fu (JP)

(72) Inventor: Atsushi Toujo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/933,416

(22) Filed: Mar. 23, 2018

(65) Prior Publication Data
US 2018/0212583 A1 Jul. 26, 2018

Related U.S. Application Data

(63) Continuation of application No. PCT/JP2016/077791, filed on Sep. 21, 2016.

(30) Foreign Application Priority Data

Dec. 24, 2015 (JP) ................. 2015-251829

(51) Int. Cl.
*H03H 7/01* (2006.01)
*H03H 7/075* (2006.01)
(Continued)

(52) U.S. Cl.
CPC .......... *H03H 7/075* (2013.01); *H03H 7/0115* (2013.01); *H03H 7/0153* (2013.01);
(Continued)

(58) Field of Classification Search
CPC ......... H03H 2001/0085; H03H 7/0115; H03H 7/0153; H03H 7/075
(Continued)

(56) References Cited

U.S. PATENT DOCUMENTS

2011/0309994 A1 12/2011 Kato et al.
2014/0049929 A1 2/2014 Yamaguchi
(Continued)

FOREIGN PATENT DOCUMENTS

JP 2000-013167 A 1/2000
JP 2001-16072828 A 6/2001
(Continued)

OTHER PUBLICATIONS

Official Communication issued in International Patent Application No. PCT/JP2016/077791, dated Dec. 13, 2016.

*Primary Examiner* — Rakesh B Patel
(74) *Attorney, Agent, or Firm* — Keating & Bennett, LLP (57) ABSTRACT

A circuit substrate includes a first electrode connecting a capacitance element, a first inductance element including a first interconnect that extends from one end connected to the first electrode to another end across a region at which the capacitance element is to be mounted, a second inductance element including a second interconnect that extends from one end connected to the first electrode to another end across the region at which the capacitance element is to be mounted from a side opposite to the first interconnect, an input terminal connected to the another end of the second interconnect, an output terminal connected to the another end of the first interconnect, and a second electrode that provides a capacitance between the output terminal and the second electrode, wherein the capacitance provided by the output terminal and the second electrode is equal to or larger than a capacitance of the capacitance element.

20 Claims, 8 Drawing Sheets

(51) Int. Cl.
*H05K 3/46* (2006.01)
*H03H 1/00* (2006.01)

(52) U.S. Cl.
CPC ....... *H05K 3/46* (2013.01); *H03H 2001/0085* (2013.01); *H03H 2210/025* (2013.01)

(58) Field of Classification Search
USPC .................................... 333/175, 176, 185
See application file for complete search history.

(56) References Cited

U.S. PATENT DOCUMENTS

2014/0247574 A1   9/2014  Tamaki
2015/0325378 A1* 11/2015  Park .................... H03H 7/0115
                                                         333/185
2016/0133532 A1   5/2016  Nishino et al.

FOREIGN PATENT DOCUMENTS

| JP | 2002-0217667 A | 8/2002 |
| JP | 2012-085251 A | 4/2012 |
| JP | 2013-077663 A | 4/2013 |
| JP | 2013-140952 A | 7/2013 |
| JP | 2014-039162 A | 2/2014 |
| JP | 2015-023134 A | 2/2015 |

\* cited by examiner

REPEATED FOR OBTAINING CAPACITANCE OF C1

REPEATED FOR OBTAINING CAPACITANCE OF C3

REPEATED FOR OBTAINING NEEDED CAPACITANCE

CIRCUIT SUBSTRATE, FILTER CIRCUIT, AND CAPACITANCE ELEMENT

CROSS REFERENCE TO RELATED APPLICATIONS

This application claims the benefit of priority to Japanese Patent Application No. 2015-251829 filed on Dec. 24, 2015 and is a Continuation Application of PCT Application No. PCT/JP2016/077791 filed on Sep. 21, 2016. The entire contents of each application are hereby incorporated herein by reference.

BACKGROUND OF THE INVENTION

1. Field of the Invention

The present invention relates to a circuit substrate, a filter circuit, and a capacitance element, and more particularly, to a circuit substrate on which a capacitance element is to be mounted, a filter circuit on which a capacitance element is mounted, and a capacitance element.

2. Description of the Related Art

A filter circuit is often used as a countermeasure against the noise of an electronic apparatus. An example of such a filter circuit is an EMI (Electro-Magnetic Interference) removing filter that passes necessary components in the electric current that flows through a conductor, while removing unnecessary components. As a circuit configuration of the filter circuit, a capacitor is sometimes used, which is a capacitance element. It is known in the art that, in a filter circuit that includes a capacitor, the noise suppression effect decreases due to an equivalent series inductance (ESL), which is a parasitic inductance, of the capacitor.

Further, in an antenna device, a configuration in which an effective inductance component of an antenna element is suppressed by using a pseudo negative inductance component of an impedance conversion circuit is known (see, for example, Japanese Patent Application Laid-Open No. 2012-85251).

However, in canceling a parasitic inductance of a capacitor by using an impedance conversion circuit as disclosed in Japanese Patent Application Laid-Open No. 2012-85251, there have been cases in which the parasitic inductance of the capacitor cannot be cancelled sufficiently even when the impedance conversion circuit is used as a filter circuit.

Also, there are cases in which a capacitor having a parasitic inductance cancelled by using a filter circuit is used as a decoupling capacitor. When the capacitor is connected to an electronic component (for example, an IC or the like) as a decoupling capacitor, the electric charge of the capacitor is able to be supplied to the electronic component even when a voltage drop occurs due to insufficient electric current supplied to the electronic component. However, when a coil is used to cancel the parasitic inductance of the capacitor, the supply of the electric charge from the capacitor to the electronic component is delayed by receiving the influence of the coil. When the electric charge supplied to the electronic component is delayed, the electric charge supplying performance of the capacitor decreases, thus causing a problem of instability in driving the electronic component.

SUMMARY OF THE INVENTION

Preferred embodiments of the present invention provide circuit substrates, filter circuits, and capacitance elements that are able to cancel parasitic inductances of capacitance elements and maintain charge supplying performances of electronic components.

A circuit substrate according to a preferred embodiment of the present invention is a circuit substrate on which a capacitance element is to be mounted, and includes an electrode connecting one terminal of the capacitance element; a first inductance element including a first interconnect that extends from one end connected to a first electrode to another end across a region in which the capacitance element is to be mounted; a second inductance element including a second interconnect that extends from one end connected to the first electrode to another end across the region in which the capacitance element is to be mounted from a side opposite to the first interconnect; an input terminal connected to the another end of the second interconnect; an output terminal connected to the another end of the first interconnect; and a second electrode that provides a capacitance between the output terminal and the second electrode, wherein the capacitance provided by the output terminal and the second electrode is equal to or larger than a capacitance of the capacitance element.

A filter circuit according to a preferred embodiment of the present invention includes the circuit substrate described above and a capacitor that is mounted on the circuit substrate as the capacitance element.

A capacitance element according to a preferred embodiment of the present invention includes a ceramic element body including a plurality of laminated ceramic layers, a pair of main surfaces that oppose each other and side surfaces that connect between the main surfaces; a plurality of internal electrodes disposed in an inside of the ceramic element body; and a plurality of external electrodes disposed on the side surfaces of the ceramic element body and respectively electrically connected to the plurality of internal electrodes, wherein the plurality of internal electrodes include a first internal electrode disposed on a first side surface of the ceramic element body, a second internal electrode disposed on a second side surface of the ceramic element body, the second side surface opposing the first side surface, a third internal electrode disposed on a third side surface of the ceramic element body, the third side surface not opposing the first side surface, and a fourth internal electrode disposed on a fourth side surface of the ceramic element body, the fourth side surface opposing the third side surface; the ceramic element body includes a first functional portion, a second functional portion, and a third functional portion that are disposed along a height direction extending between the pair of main surfaces that oppose each other; the first functional portion includes a first inductance element including a first interconnect that extends from one end connected to the first internal electrode to the third internal electrode and a second inductance element including a second interconnect that extends from one end connected to the first internal electrode to the fourth internal electrode and crosses over the first interconnect; the second functional portion includes a first planar electrode connected to the first internal electrode and a second planar electrode connected to the second internal electrode; the third functional portion includes the second planar electrode and a third planar electrode connected to the third internal electrode; and a capacitance provided in the third functional portion is equal to or larger than a capacitance provided in the second functional portion.

According to a preferred embodiment of the present invention, the first inductance element and the second inductance element are provided, and the capacitance provided by the output terminal and the second electrode is equal to or larger than the capacitance of the capacitance element, so that the parasitic inductance of the capacitance element is able to be cancelled, and the charge supplying performance to the electronic components is able to be maintained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, circuit substrates, filter circuits, and capacitor elements according to preferred embodiments of the present invention will be described with reference to the drawings.

Preferred Embodiment 1

Figure 1:
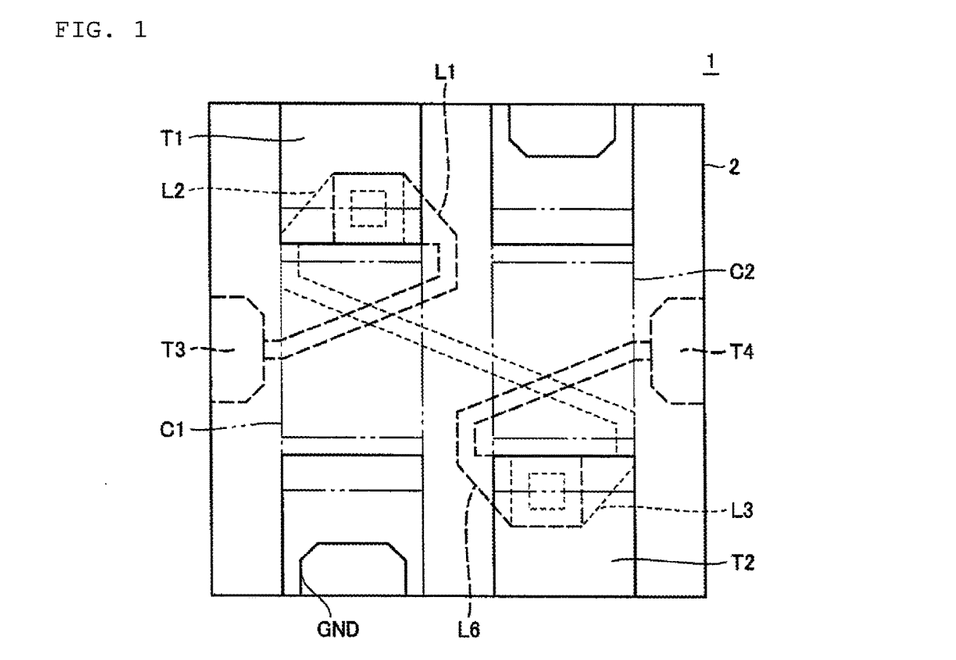
FIG. 1 is a plan view of a filter circuit according to Preferred Embodiment 1 of the present invention.
Figure 2:
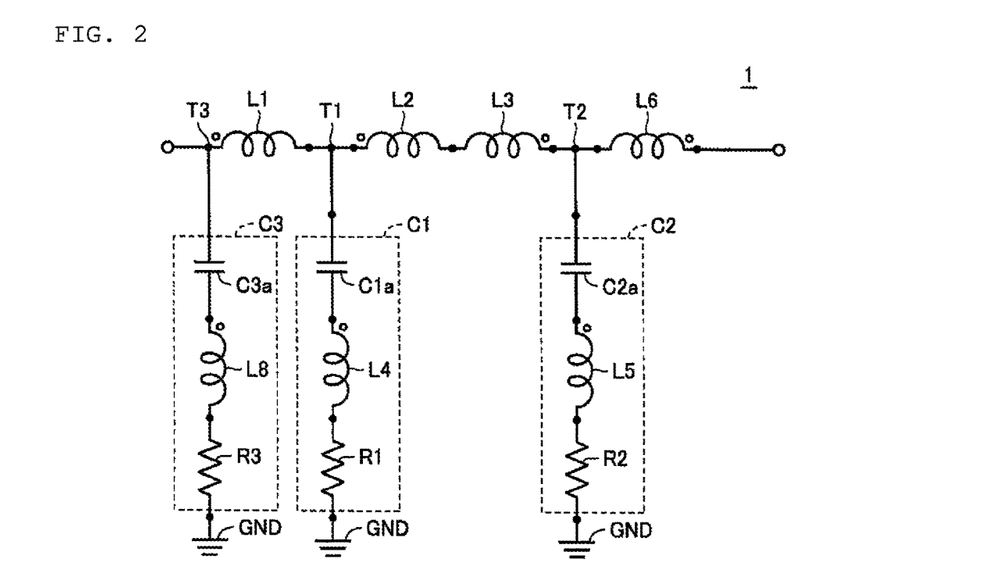
FIG. 2 is a circuit diagram of the filter circuit according to Preferred Embodiment 1 of the present invention.

A circuit substrate and a filter circuit according to Preferred Embodiment 1 of the present invention will be described with reference to the drawings. FIG. 1 is a plan view of a filter circuit according to Preferred Embodiment 1 of the present invention. FIG. 2 is a circuit diagram of a filter circuit 1 according to Preferred Embodiment 1 of the present invention.

The filter circuit 1 is preferably, for example, an EMI removing filter and is a fifth-order T-type LC filter circuit. Here, in the present preferred embodiment, description will be provided by using a fifth-order T-type LC filter circuit as a configuration of the filter circuit. However, for example, a preferred embodiment of the present invention may also be applied to a third-order T-type LC filter circuit or a higher-order T-type LC filter circuit in the same or substantially the same manner. First, referring to FIG. 2, the filter circuit 1 includes capacitors C1, C2, electrodes T1 to T3, a ground electrode GND, and inductors L1 to L3, L6.

Referring to FIG. 2, the capacitor C1 includes one end connected to the electrode T1 (first electrode) and the other end connected to the ground electrode GND. The capacitor C1 include an inductor L4 as a parasitic inductance (equivalent series inductance (ESL)) and a resistor R1 as a parasitic resistance (equivalent series resistance (ESR)) and is equivalent to a circuit configuration in which the inductor L4 and the resistor R1 are connected to a capacitor C1a in series. In addition to the capacitor C1, the inductor L1, and the inductor L2 are connected to the electrode T1. The inductor L1 and the inductor L2 are closely connected to generate a pseudo negative inductance component. This negative inductance component is able to cancel the parasitic inductance of the capacitor C1 (inductor L4), such that the inductance component of the capacitor C1 is able to be made smaller. When a circuit including the capacitor C1, the inductor L1, and the inductor L2 is regarded as a third-order T-type LC filter circuit, the filter circuit improves the noise reduction and prevention effect in a high-frequency band by canceling the parasitic inductance (inductor L4) with the negative inductance component of the inductor L1 and the inductor L2.

The capacitor C2 includes one end connected to the electrode T2 and the other end connected to the ground electrode GND. The capacitor C2 includes an inductor L5 as a parasitic inductance and a resistor R2 as a parasitic resistance and is equivalent to a circuit configuration in which the inductor L5 and the resistor R2 are connected to a capacitor C2a in series. In addition to the capacitor C2, the inductor L3 and the inductor L6 are connected to the electrode T2. The inductor L3 and the inductor L6 are closely connected to generate a pseudo negative inductance component. This negative inductance component is able to cancel the parasitic inductance of the capacitor C2 (inductor L5), such that the inductance component of the capacitor C2 is able to be made smaller. When a circuit including the capacitor C2, the inductor L3, and the inductor L6 is regarded as a third-order T-type LC filter circuit, the filter circuit improves the noise reduction and prevention effect in a high-frequency band by canceling the parasitic inductance (inductor L5) with the negative inductance component of the inductor L3 and the inductor L6.

The filter circuit 1 is connected to an electronic component, such as an IC, for example, with the electrode T3 defining an output terminal. In particular, when the capacitor mounted on the filter circuit 1 is used as a decoupling capacitor, the electric charge is able to be supplied to the electronic component using the capacitor in the filter circuit 1 even when a voltage drop occurs due to insufficient electric current supplied to the electronic component. However, when the electric charge of the capacitor C1 is supplied to the electronic component, the electric charge is supplied to the electronic component via the inductor L1, so that the charge supplied to the electronic component is delayed, leading to a decrease in the charge supplying performance. Accordingly, in the filter circuit 1, a capacitor C3 is provided between the ground electrode GND (second electrode) and the electrode T3. The capacitor C3 includes an inductor L8 as a parasitic inductance and a resistor R3 as a parasitic resistance.

The filter circuit 1 is able to reduce or prevent a delay of the electric charge supplied to the electronic component by providing the capacitor C3 between the electrode T3 and the ground electrode GND and capable of supplying the electric charge from the electrode T3 (output terminal) to the electronic component without passing through the inductor L1. In other words, the filter circuit 1 is able to improve the noise reduction and prevention effect in a high-frequency band by canceling the parasitic inductance while maintaining the charge supplying performance.

Referring to FIG. 1, in the filter circuit 1, the capacitor C1 and the capacitor C2 are mounted in parallel on the circuit substrate 2. The electrodes T1 to 14 are provided on a surface of the circuit substrate 2 at which the capacitor C1 and the capacitor C2 are mounted.

The circuit substrate 2 is preferably a multilayer substrate made of a glass epoxy substrate, for example, and includes a plurality of layers. The electrode T1 and the electrode T2 are provided on the first layer which is a surface at which the capacitor C1 and the capacitor C2 are mounted. In addition, electrodes other than the electrode T1 and the electrode T2 at which the capacitor C1 and the capacitor C2 are mounted are provided on the first layer. On the second layer that is located below the first layer, coil-shaped interconnect patterns of the inductor L1 and the inductor L6 are provided, and the electrode T3 and the electrode 14 respectively connected to one terminal of the inductor L1 and the inductor L6 are provided. Although not illustrated in the drawing, the electrode T3 includes an electrode provided on the first layer as an output terminal capable of being connected to the electronic component, and the electrode 14 includes an electrode provided on the first layer as an input terminal. On the third layer located further below, coil-shaped interconnect patterns of the inductor L2 and the inductor L3 are provided, and the ground electrode GND defining the capacitor C3 with the electrode T3 is provided.

Referring to FIG. 1, the coil-shaped interconnect pattern of the inductor L1 includes an interconnect pattern with a straight-line portion that is connected to the electrode T1 and extends along the longitudinal direction of the capacitor C1 and an interconnect pattern with an oblique line portion that extends across the capacitor C1 and to the electrode T3. Referring to FIG. 1, the coil-shaped interconnect pattern of the inductor L2 includes an interconnect pattern with a straight-line portion that is connected to the electrode T1 and extends along the longitudinal direction of the capacitor C1 and an interconnect pattern with an oblique line portion that extends across the capacitor C1 from a side opposite to the interconnect pattern of the inductor L1 and extends in a direction towards the capacitor C2. The coil-shaped interconnect pattern of the inductor L1 and the coil-shaped interconnect pattern of the inductor L2 preferably have the same or substantially the same shape and are line-symmetric with respect to the electrode T1. Also, the interconnect pattern of the oblique line portion of the inductor L1 and the interconnect pattern of the oblique line portion of the inductor L2 intersect with each other in a plan view at a position at which the capacitor C1 is mounted, and an angle between the interconnect pattern with the oblique line portion of the inductor L1 and the interconnect pattern of the oblique line portion of the inductor L2 is other than a right angle. In other words, the interconnect pattern of the oblique line portion of the inductor L1 and the interconnect pattern of the oblique line portion of the inductor L2 do not intersect with each other perpendicularly or substantially perpendicularly. Here, the plan view refers to a field of view seen from a normal line direction of the surface of the circuit substrate 2 on which the capacitors C1, C2 are mounted.

Similarly, referring to FIG. 1, the coil-shaped interconnect pattern of the inductor L6 includes an interconnect pattern with a straight-line portion that is connected to the electrode T2 and extends along the longitudinal direction of the capacitor C2 and an interconnect pattern with an oblique line portion that extends across the capacitor C2 and to the electrode T4. Referring to FIG. 1, the coil-shaped interconnect pattern of the inductor L3 includes an interconnect pattern with a straight-line portion that is connected to the electrode T2 and extends along the longitudinal direction of the capacitor C2 and an interconnect pattern with an oblique line portion that extends across the capacitor C2 from a side opposite to the interconnect pattern of the inductor L6 and extends in a direction towards the capacitor C1. The coil-shaped interconnect pattern of the inductor L6 and the coil-shaped interconnect pattern of the inductor L3 preferably have the same or substantially the same shape and are line-symmetric with respect to the electrode T2. Also, the interconnect pattern of the oblique line portion of the inductor L6 and the interconnect pattern of the oblique line portion of the inductor L3 intersect with each other in a plan view at a position at which the capacitor C2 is mounted, and an angle between the interconnect pattern of the oblique line portion of the inductor L6 and the interconnect pattern of the oblique line portion of the inductor L3 is other than a right angle. In other words, the interconnect pattern of the oblique line portion of the inductor L6 and the interconnect pattern of the oblique line portion of the inductor L3 do not intersect with each other perpendicularly or substantially perpendicularly.

Referring to FIG. 1, the coil-shaped interconnect patterns of the inductor L2 and the inductor L3 are provided continuously and may be regarded as being one inductance element. In other words, the left-side half in the drawing of one inductance element defines and functions as the inductor L2, and the right-side half in the drawing of the one inductance element defines and functions as the inductor L3. This reduces the production cost of the inductor L2 and the inductor L3. The inductor L2 and the inductor L3 may also be separately provided.

Preferably, the interconnect pattern of the inductor L1 has a coil shape in which the winding direction is a counterclockwise direction from one electrode T3 to the electrode T1, and the interconnect pattern of the inductor L2 has a coil shape in which the winding direction is a counterclockwise direction from the electrode T1 to the inductor L3 side. For this reason, the winding directions of the coils of the inductor L1 and the inductor L2 are the same counterclockwise direction. On the other hand, preferably, the interconnect pattern of the inductor L6 has a coil shape in which the winding direction is a clockwise direction from the electrode T2 to the other electrode 14, and the interconnect pattern of the inductor L3 has a coil shape in which the winding direction is a clockwise direction from the inductor L2 side to the electrode T2. For this reason, the winding directions of the coils of the inductor L3 and the inductor L6 are the same clockwise direction. Further, the winding directions of the inductor L1 and the inductor L2 are preferably different from the winding directions of the inductor L3 and the inductor L6.

The inductor L1 and the inductor L2 are electrically connected by a common via provided in the electrode T1. Similarly, the inductor L3 and the inductor L6 are electrically connected by a common via provided in the electrode T2.

Between the electrode T3 and the ground electrode GND, a glass epoxy substrate (a portion of the circuit substrate 2) located between the second layer and the third layer of the circuit substrate 2 is disposed and defines the capacitor C3 between the electrode T3 and the ground electrode GND with the glass epoxy substrate interposed therebetween. The capacitance of the capacitor C3 may differ depending on the amount of electric charge required for the electronic component connected to the output terminal, but may sufficiently be at least the capacitance of the capacitor C1. Here, a description has been provided of the capacitor C3 including the electrode T3 and the ground electrode GND. However, the capacitor C3 may be provided by directly connecting a capacitance element instead of defining the capacitor C3 with the electrode T3 and the ground electrode GND. Also, an electrode may be provided on an upper surface and lower surface of the circuit substrate 2, and the two electrodes may define the capacitor C3 via the circuit substrate 2.

Next, a detailed description will be provided of a relationship between the capacitance of the capacitor C1 and the capacitance of the capacitor C3 in the filter circuit 1. Here, it is assumed that the filter circuit 1 described below is a third-order T-type LC filter circuit including the capacitor C1 and the inductors L1, L2 for the sake of a simple description. FIGS. 3A to 3D are circuit diagram of a case in which the capacitances of the capacitors C1, C3 are changed in the filter circuit 1 according to Preferred Embodiment 1 of the present invention. Here, in FIGS. 3A to 3D, a description will be provided by omitting the parasitic resistance that is present within the capacitors C1, C3.

Figure 3A:
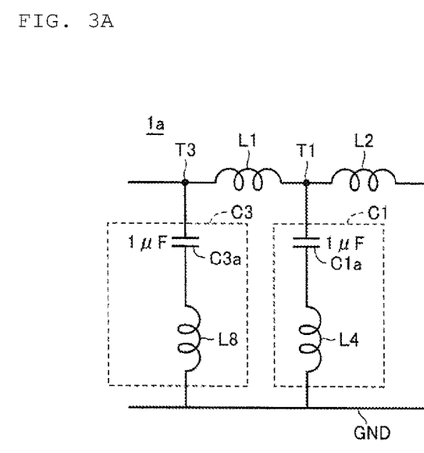
FIGS. 3A to 3D are circuit diagrams of a case in which the capacitance of the capacitor is changed in the filter circuit according to Preferred Embodiment 1 of the present invention.

First, in a filter circuit 1a shown in FIG. 3A, the inductor L1 and the inductor L2 are connected to one electrode T1 of the capacitor C1. The capacitor C1 has a circuit configuration in which the inductor L4, which is a parasitic inductance, is connected in series to the capacitor C1a. Preferably, the capacitance of the capacitor C1a is about 1 µF, and the inductance component of the inductor L4 is about 0.3 nH, for example. When the inductance components of the inductor L1 and the inductor L2 are each about 1.0 nH and the coupling coefficient K is about 0.3, the inductor L1 and the inductor L2 are able to cancel the parasitic inductance (inductor L4) of the capacitor C1. The capacitor C3 including the electrode T3 that defines the output terminal and the ground electrode GND also has a circuit configuration in which the inductor L8, which is a parasitic inductance, is connected in series to the capacitor C3a. Preferably, the capacitance of the capacitor C3a is about 1 µF, and the inductance component of the inductor L8 is about 0.3 nH, for example. In other words, in the filter circuit 1a, the capacitance of the capacitor C3, and the capacitance of the capacitor C1 are preferably the same or substantially the same and in a relationship of 1:1 or about 1:1, for example.

Figure 3B:
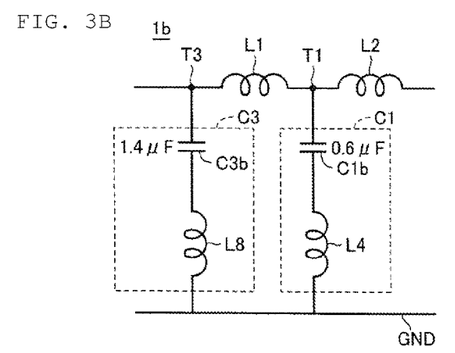

A filter circuit 1b shown in FIG. 3B has the same configuration as the filter circuit 1a except that the capacitances of the capacitors C1a, C3a in the filter circuit 1a are different. For this reason, detailed description of the filter circuit 1b will be omitted by denoting the elements similar to those of the filter circuit 1a with the same reference symbols. In the filter circuit 1b, preferably, the capacitance of a capacitor C3b is about 1.4 µF, and the capacitance of a capacitor C1b is about 0.6 µF, so that the capacitance of the capacitor C3 and the capacitance of the capacitor C1 are in a relationship of 7:3 or about 7:3, for example.

Figure 3C:
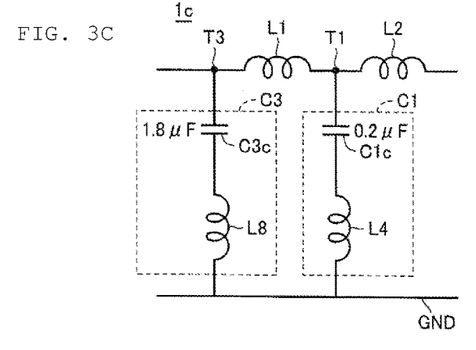
Figure 3D:
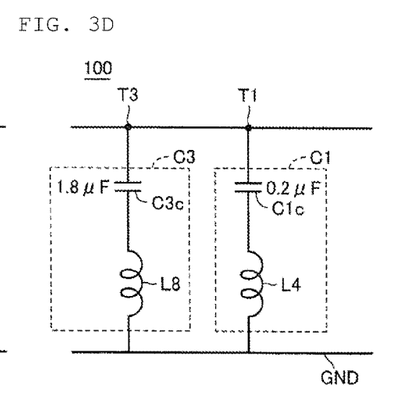

The filter circuit 1c shown in FIG. 3C has the same configuration as the filter circuit 1a except that the capacitances of the capacitors C1a, C3a in the filter circuit 1a are different. For this reason, detailed description of the filter circuit 1c will be omitted by denoting the elements similar to those of the filter circuit 1a with the same reference symbols. In the filter circuit 1c, preferably the capacitance of a capacitor C3c is about 1.8 µF, and the capacitance of a capacitor C1c is about 0.2 µF, so that the capacitance of the capacitor C3 and the capacitance of the capacitor C1 are in a relationship of 9:1 or about 9:1, for example. Here, a filter circuit 100 shown in FIG. 3D is described as a comparative example with the filter circuits 1a to 1c. The filter circuit 100 has a configuration in which the inductor L1 and the inductor L2 have been removed from the filter circuit 1c, and is a circuit that does not cancel the parasitic inductance.

Figure 4A:
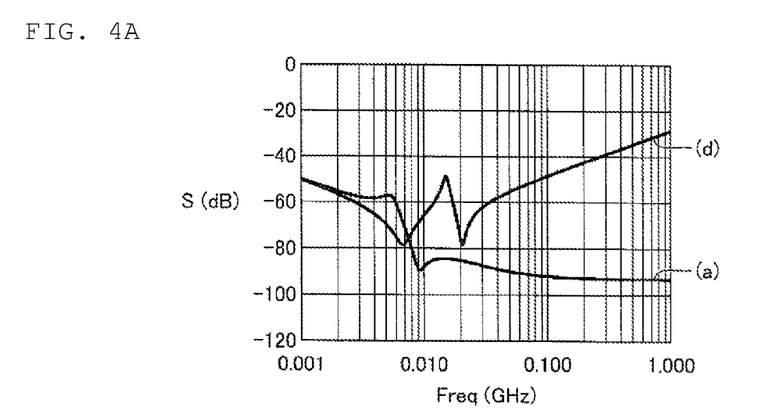
FIGS. 4A to 4C are graphs showing transmission characteristics of the filter circuit according to Preferred Embodiment 1 of the present invention relative to the frequency.
Figure 4B:
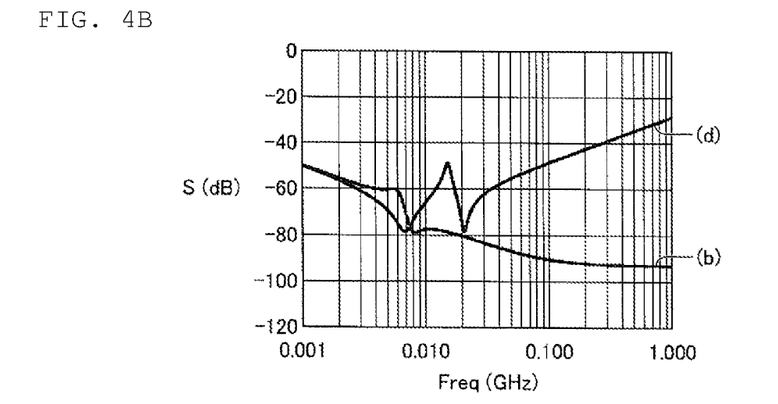
Figure 4C:
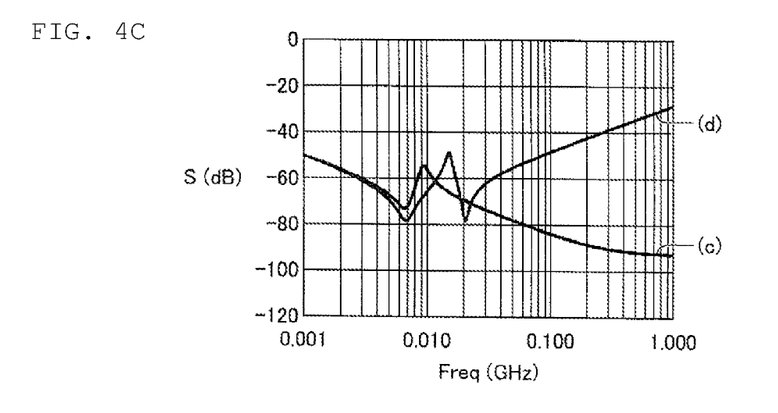

FIGS. 4A to 4C are graphs showing transmission characteristics of the filter circuit 1 according to Preferred Embodiment 1 of the present invention relative to the frequency. The graphs of FIGS. 4A to 4C are a result of showing transmission characteristics relative to the frequency by performing circuit simulation on the filter circuits 1a to 1c, 100 shown in FIGS. 3A to 3D. In the graphs shown in FIGS. 4A to 4C, the lateral axis represents the frequency Freq (GHz), and the longitudinal axis represents the transmission characteristics S (dB). Here, the results shown in FIGS. 4A to 4C are a result of performing the circuit simulation assuming that the resistance of the coil serving as the inductor is about 0.01Ω/nH.

First, the graph shown in FIG. 4A shows transmission characteristics when the filter circuit 1a and the filter circuit 100 are compared. In the filter circuit 100 that is not provided with the inductor L1 and the inductor L2, the transmission characteristics suddenly rise at the frequency Freq of about 0.020 GHz or more (the graph of (d) in the drawing), and the noise in a high-frequency band cannot be reduced or prevented. On the other hand, in the filter circuit 1a, the transmission characteristics S decrease sufficiently at the frequency Freq of about 0.010 GHz or more (the graph of (a) in the drawing), and the noise reduction and prevention effect in a high-frequency band is improved. However, since the capacitance of the capacitor C1 and the capacitance of the capacitor C3 are the same, the self-resonant frequencies of the two capacitors coincide with each other to generate resonance. In the graph shown in FIG. 4A, the resonance is generated between about 0.004 GHz and about 0.005 GHz.

Next, the graph shown in FIG. 4B shows transmission characteristics when the filter circuit 1b and the filter circuit 100 are compared. In the filter circuit 1b, the transmission characteristics S decrease sufficiently at the frequency Freq of about 0.010 GHz or more (the graph of (b) in the drawing), and the noise reduction and prevention effect in a high-frequency band is improved. Furthermore, since the capacitance of the capacitor C1 and the capacitance of the capacitor C3 are different, the self-resonant frequencies of the two capacitors are also different. For this reason, although resonance is generated between the self-resonant frequency of the capacitor C1 and the self-resonant frequency of the capacitor C3, resonance with high transmission characteristics S between about 0.004 GHz and about 0.005 GHz, as shown in the graph of FIG. 4A, is not generated.

Next, the graph shown in FIG. 4C shows transmission characteristics when the filter circuit 1c and the filter circuit 100 are compared. In the filter circuit 1c, the transmission characteristics S decrease sufficiently at the frequency Freq of about 0.010 GHz or more (the graph of (c) in the drawing), and the noise reduction and prevention effect in a high-frequency band is improved. Furthermore, since the capacitance of the capacitor C1 and the capacitance of the capacitor C3 are different, the self-resonant frequencies of the two capacitors are also different. For this reason, although resonance is generated between the self-resonant frequency of the capacitor C1 and the self-resonant frequency of the capacitor C3, resonance with high transmission characteristics S between about 0.004 GHz and about 0.005 GHz, as shown in the graph of FIG. 4A, is not generated. Conversely, in the graph shown in FIG. 4B, resonance with high transmission characteristics S is generated in the vicinity of about 0.010 GHz.

In this manner, when the capacitance of the capacitor C3 is equal to or larger than the capacitance of the capacitor C1, the filter circuit 1 is able to sufficiently decrease the transmission characteristics at a high frequency while maintaining the charge supplying performance of supplying electric charge to the electronic component. Here, in order to avoid a situation in which the self-resonant frequencies of the two capacitors coincide with each other to generate resonance with high transmission characteristics S, it is necessary for the capacitance of the capacitor C1 and the capacitance of the capacitor C3 to be different from each other. In particular, when the capacitance of the capacitor C3 and the capacitance of the capacitor C1 are in a relationship of equal to or larger than 7:3 or about 7:3, resonance with high transmission characteristics S is not generated between about 0.004 GHz and about 0.005 GHz.

As described above, in the filter circuit 1 according to the present preferred embodiment, the inductor L1 and the inductor L2 are connected to the electrode T1 that is connected to one terminal of the capacitor C1, and the ground electrode GND (second electrode) that provides a capacitance between the electrode T3 serving as an output terminal and the ground electrode GND is provided, the parasitic inductance (inductor L4) of the capacitor C1 is able to be cancelled, and the charge supplying performance to the electronic component is able to be maintained.

Here, in the circuit substrate 2 according to the present preferred embodiment, an electrode (third electrode) that defines a capacitance between the electrode T4 defining an input terminal and the third electrode may be further provided to define a capacitor between the electrode T4 and the third electrode. This enables use of the circuit substrate 2 even by changing the electrode T4 to be an output terminal and changing the electrode T3 to be an input terminal. Also, by providing different capacitances between the capacitor C3 defined by the electrode T3 and the ground electrode GND (second electrode) and the capacitor defined by the electrode T4 and the electrode (third electrode), the charge supplying performance to the electronic component is able to be made to differ by selecting whether the electrode T3 is used as the output terminal or the electrode T4 is used as the output terminal.

Also, in the circuit substrate 2 according to the present preferred embodiment, an angle between the interconnect pattern of the oblique line portion of the inductor L1 and the interconnect pattern of the oblique line portion of the inductor L2 is preferably other than a right angle as shown in FIG. 1, so that, even when a stacking shift is generated in the circuit substrate due to variations in production, the influence on the negative inductance component to cancel the parasitic inductance of the capacitors C1, C2 is small.

Description has been provided assuming that the capacitors C1, C2 are multilayer ceramic capacitors, for example. However, the capacitors C1, C2 need not be multilayer ceramic capacitors including BaTiO$_3$ (barium titanate) as a major component, but may be multilayer ceramic capacitors including other materials as a major component. Further, the capacitors C1, C2 are not limited to multilayer ceramic capacitors, and for example, the capacitors C1, C2 may be capacitors of other types, such as aluminum electrolytic capacitors, for example.

Referring to FIG. 1, description has been provided of a case in which the sizes of the inductors L1, L2 respectively provided in the capacitors C1, C2 are the same. However, the present invention is not limited to this. For example, when the parasitic inductances that are to be cancelled respectively in the capacitors C1, C2 are different, the inductors L1, L2 may differ in the size, the shape of the interconnect pattern, or other parameters. Also, description has been provided assuming that the inductor L1 is provided on the second layer of the multilayer substrate and the inductor L2 is provided on the third layer. However, the present invention is not limited to this. For example, the inductor L2 may be provided on the second layer, and the inductor L1 may be provided on the third layer.

Further, description has been provided assuming that the circuit substrate 2 is a multilayer substrate made of a glass epoxy substrate. However, the present invention is not limited to this. For example, the circuit substrate 2 may be a single-layer substrate, and the electrode T1 and the electrode T2, the coil-shaped interconnect patterns of the inductor L1 and the inductor L6, and the coil-shaped interconnect patterns of the inductor L2 and the inductor L3 may be provided on the same plane. In this case, at the intersection portion 12 of the inductor L1 and the inductor L2 and at the intersection portion of the inductor L6 and the inductor L3, an insulating film must be provided in order to prevent electrical contact of the interconnect patterns with each other.

Further, in Preferred Embodiment 1 of the present invention, description has been provided assuming that the coil-shaped interconnect pattern of the inductor L1 and the coil-shaped interconnect pattern of the inductor L2 have the same or substantially the same shape and are line-symmetric with respect to the electrode T1. However, the present invention is not limited to this.

Preferred Embodiment 2

Figure 5:
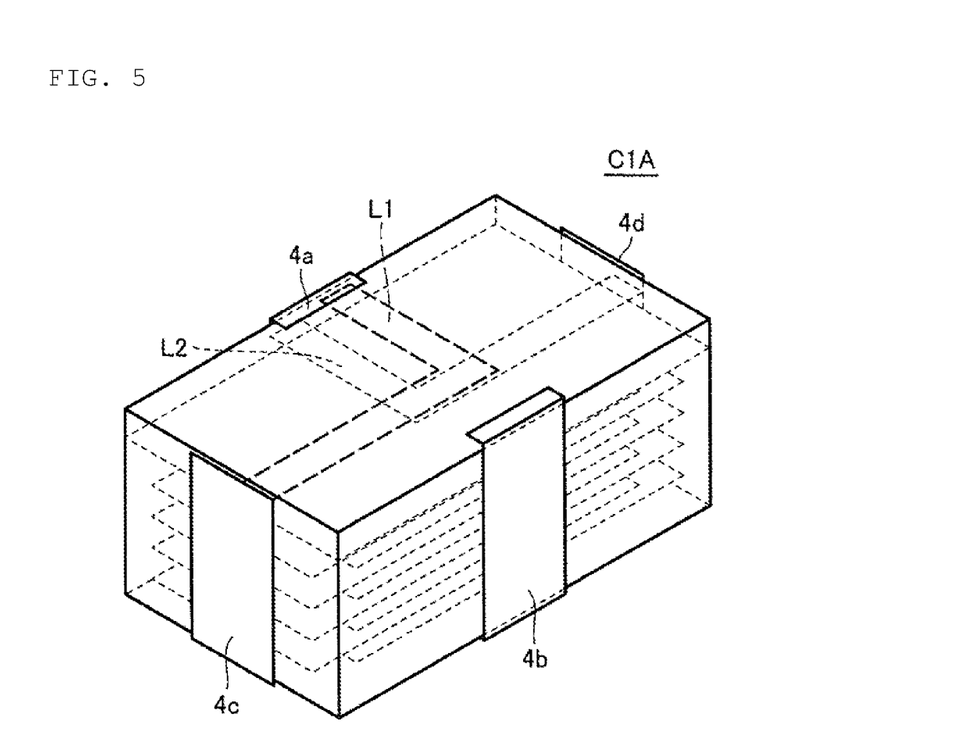
FIG. 5 is a perspective view of a capacitor according to Preferred Embodiment 2 of the present invention.

In Preferred Embodiment 1 of the present invention, description has been provided of the filter circuit 1 in which the inductors L1 to L3, L6, and the capacitor C3 are provided on the circuit substrate 2, and the capacitors C1, C2 are mounted on the circuit substrate 2, as shown in FIG. 1. However, the inductors and capacitors provided on the circuit substrate 2 may be provided in an inside of the capacitance element. Accordingly, in Preferred Embodiment 2 of the present invention, description will be provided on a capacitance element including portions of the inductors and capacitors. FIG. 5 is a perspective view of a capacitor according to Preferred Embodiment 2 of the present invention.

Figure 6:
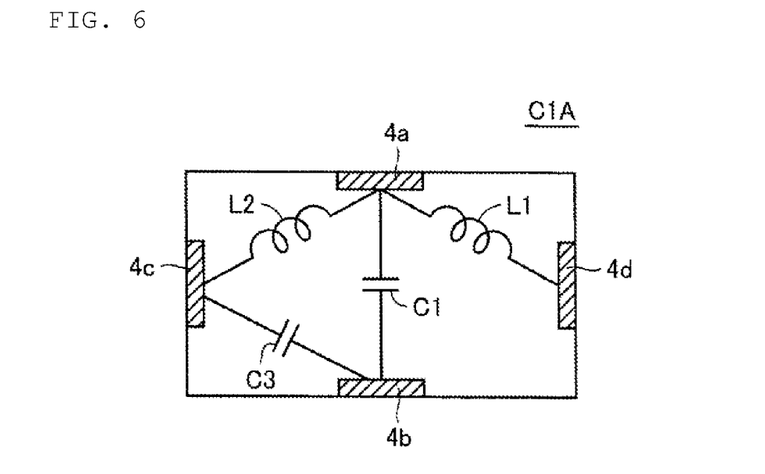
FIG. 6 is a circuit diagram showing an equivalent circuit of the capacitor according to Preferred Embodiment 2 of the present invention.

A capacitor C1A shown in FIG. 5 is a multilayer ceramic capacitor including a plurality of internal electrodes and dielectric ceramic layers that obtain electrostatic capacitance that are alternately laminated. The laminated internal electrodes are extended alternately at one end and at the other end of the capacitor C1A. The internal electrodes extended to the respective ends are connected to external electrodes 4a, 4b disposed at the respective ends of the capacitor C1A. Further, in the capacitor C1A, inductors L1, L2 are provided in the inside in order to cancel the parasitic inductance, and also the capacitor C3 is provided in the inside in order to supply electric charge. FIG. 6 is a circuit diagram showing an equivalent circuit of the capacitor C1A according to Preferred Embodiment 2 of the present invention. The equivalent circuit shown in FIG. 6 includes a capacitor C1, which is an inherent capacitance of the capacitor C1A, inductors L1, L2, and a capacitor C3 supplying electric charge. The inductors L1, L2 are respectively connected to the external electrode 4a to which one end of the capacitor C1 is connected. One end of the capacitor C3 is connected to the external electrode 4b to which the other end of the capacitor C1 is connected. The inductor L1 and the other end of the capacitor C3 are connected to the external electrode 4c defining an output terminal. The inductor L2 is connected to the external electrode 4d defining an input terminal.

The inductors L1, L2 are provided on an upper layer side of the capacitor C1A as viewed in the drawing and are provided above the dielectric ceramic layer in which the capacitor C1 is provided. The inductor L1 is an interconnect pattern that is connected to the external electrode 4a (corresponding to the electrode T1 shown in FIG. 1) to extend to the external electrode 4c. The inductor L2 is an interconnect pattern that is connected to the external electrode 4a in the same or substantially the same manner as the inductor L1 to extend to the external electrode 4d and crosses over the inductor L1. The external electrode 4d is provided on a surface opposite to the external electrode 4c of the capacitor C1A connected to the inductor L1. Here, as will be described later, in the capacitor C1A, the capacitor C3 is provided on a lower layer side as viewed in the drawing, and the capacitor C3 is provided below the dielectric ceramic layer in which the capacitor C1 is provided.

FIGS. 7A to 7F are exploded plan views showing a configuration of the capacitor C1A according to Preferred Embodiment 2 of the present invention. Referring to FIGS. 7A to 7F, an electrode pattern is preferably formed by applying an electroconductive paste (for example, Ni paste) on barium titanate based ceramic green sheets (for example, ceramic green sheets (ceramic element bodies) having a thickness of about 3 µm after firing) 3a to 3f by the screen printing method. On the ceramic green sheet 3a shown in FIG. 7A, internal electrode patterns 4a1 to 4d1 connected respectively to the external electrodes 4a to 4d are provided. Further, on the ceramic green sheet 3a, an internal electrode pattern having an interconnect shape that connects the internal electrode pattern 4a1 and the internal electrode pattern 4c1 is provided so as to define the inductor L1.

Figure 7A:
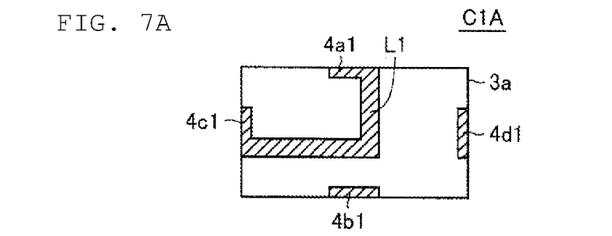
FIGS. 7A to 7F are exploded plan views showing a configuration of the capacitor according to Preferred Embodiment 2 of the present invention.
Figure 7B:
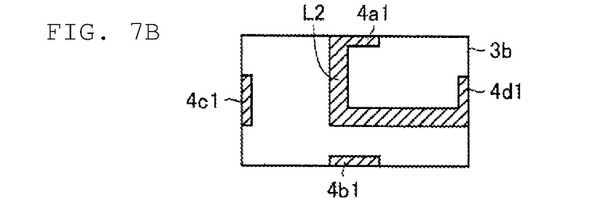

On the ceramic green sheet 3b shown in FIG. 7B, the internal electrode patterns 4a1 to 4d1 connected respectively to the external electrodes 4a to 4d are provided. Further, on the ceramic green sheet 3b, an internal electrode pattern having an interconnect shape that connects the internal electrode pattern 4a1 and the internal electrode pattern 4d1 is provided so as to define the inductor L2. The ceramic green sheets 3a, 3b define the first functional portion of the inductors L1, L2.

Figure 7C:
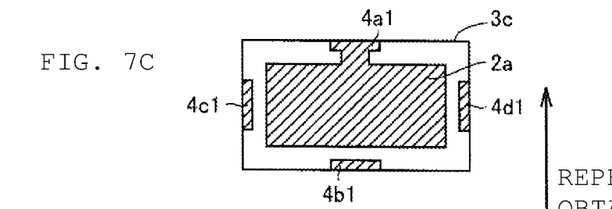

On the ceramic green sheet 3c shown in FIG. 7C, the internal electrode patterns 4a1 to 4d1 connected respectively to the external electrodes 4a to 4d are provided. Further, on the ceramic green sheet 3c, a planar electrode pattern 2a having a planar shape and connected to the internal electrode pattern 4a1 is provided so as to define one electrode of the capacitor C1.

Figure 7D:
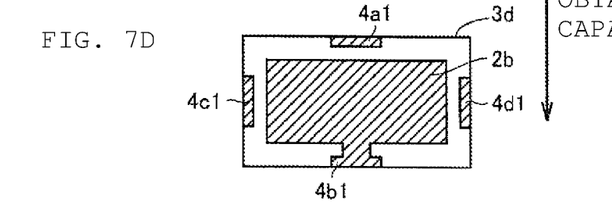

On the ceramic green sheet 3d shown in FIG. 7D, the internal electrode patterns 4a1 to 4d1 connected respectively to the external electrodes 4a to 4d are provided. Further, on the ceramic green sheet 3d, a planar electrode pattern 2b having a planar shape and connected to the internal electrode pattern 4b1 is provided so as to define the other electrode of the capacitor C1. The capacitance required in the capacitor C1 is provided by repetitively laminating (for example, 100 layers) of the ceramic green sheets 3c, 3d. The ceramic green sheets 3c, 3d define the second functional portion of the capacitor C1.

Figure 7E:
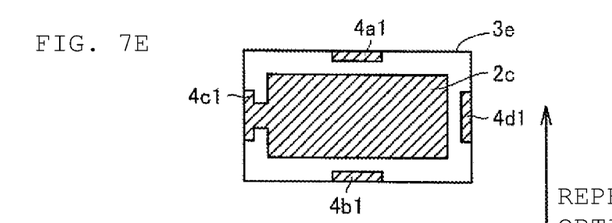

On the ceramic green sheet 3e shown in FIG. 7E, the internal electrode patterns 4a1 to 4d1 connected respectively to the external electrodes 4a to 4d are provided. Further, on the ceramic green sheet 3e, a planar electrode pattern 2c having a planar shape and connected to the internal electrode pattern 4c1 is provided so as to define one electrode of the capacitor C3.

Figure 7F:
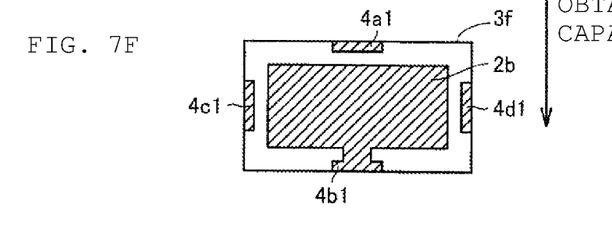

On the ceramic green sheet 3f shown in FIG. 7F, internal electrode patterns 4a1 to 4d1 connected respectively to the external electrodes 4a to 4d are provided. Further, on the ceramic green sheet 3f, a planar electrode pattern 2b having a planar shape and connected to the internal electrode pattern 4b1 is provided so as to define the other electrode of the capacitor C3. The capacitance required in the capacitor C3 is ensured by repetitively lamination (for example, 200 layers) of the ceramic green sheets 3e, 3f. The ceramic green sheets 3e, 3f define the third functional portion of the capacitor C3. Here, the ceramic green sheet 3f preferably has the same or substantially the same electrode pattern as the ceramic green sheet 3d.

The plurality of ceramic green sheets 3a to 3f are laminated, and a plurality of layers (for example, 25 layers) of ceramic green sheets (dummy layers) on which no internal electrode pattern is printed are laminated on each of the upper and lower surfaces thereof. An unfired laminate is formed by press-bonding the plurality of ceramic green sheets 3 including the dummy layers. The laminate is split into a large number of capacitors C1A by a method, such as dicing, for example. The laminate obtained by splitting is fired, and a copper electrode is fired and attached to the outside of the fired laminate so as to provide electrical connection to the internal electrode patterns 4a1, 4b1, thus forming the external electrodes 4a, 4b. Further, a copper electrode is fired and attached to the side surfaces of the fired laminate so as to provide electrical connection to the internal electrode patterns 4c1, 4d1, thus forming the external electrodes 4c, 4d.

The capacitance of the capacitor C1 and the capacitance of the capacitor C3 is able to be adjusted by selecting the number of ceramic green sheets 3c to 3f to be laminated. For example, when the same number of ceramic green sheets are laminated, the capacitance of the capacitor C1 and the capacitance of the capacitor C3 will be equal or substantially equal to each other. The number of ceramic green sheets 3c to 3f to be laminated may be adjusted so that the ratio of the capacitance of the capacitor C3 to the capacitance of the capacitor C1 will be equal to or larger than 7:3 or about 7:3, as described in Preferred Embodiment 1. Here, in the capacitor C1A, the number of ceramic green sheets 3c to 3f to be laminated may preferably be adjusted so that the capacitance of the capacitor C3 will be equal to or larger than the capacitance of the capacitor C1.

As described above, the capacitor C1A according to the present preferred embodiment of the present invention preferably includes the first functional portion, the second functional portion, and the third functional portion. The first functional portion includes the inductor L1 including a first interconnect that extends from one end connected to the internal electrode pattern 4a1 to the internal electrode pattern 4c1 and the inductor L2 including a second interconnect that extends from one end connected to the internal electrode pattern 4a1 to the internal electrode pattern 4d1 and crosses over the first interconnect. The second functional portion includes a planar electrode pattern 2a connected to the internal electrode pattern 4a1 and a planar electrode pattern 2b connected to the internal electrode pattern 4b1. The third functional portion includes the planar electrode pattern 2b connected to the internal electrode pattern 4b1 and a planar electrode pattern 2c connected to the internal electrode pattern 4c1. For this reason, the capacitor C1A according to the present preferred embodiment is able to cancel the parasitic inductance (inductor L4) of the capacitor C1 and maintain the charge supplying performance to the electronic component.

Here, in the capacitor C1A according to the present preferred embodiment, a capacitor may be provided between the external electrode 4d defining an input terminal and the external electrode 4b. This enables use of the capacitor C1A by changing the external electrode 4d to be an output terminal and changing the external electrode 4c to be an input terminal. Also, by providing a difference in the capacitance between the capacitor C3 between the external electrode 4c and the external electrode 4b and the capacitor between the external electrode 4d and the external electrode 4b, the charge supplying performance to the electronic component may be made to differ by selecting whether the external electrode 4c is used as the output terminal or the external electrode 4d is used as the output terminal. Furthermore, in the capacitor C1A according to the present preferred embodiment, the capacitor C3 is provided on a lower layer side, and the capacitor C3 is provided below the dielectric ceramic layer at which the capacitor C1 is provided. Accordingly, the capacitor C3 is not significantly affected by the inductors L1, L2, and delay of the electric charge that is supplied to the electronic component connected to the output terminal is able to be reduced or prevented. Also, in the capacitor C1A according to the present preferred embodiment, the same or substantially the same configuration as in the inductors L1, L2 described in Preferred Embodiment 1 may be provided.

Preferred Embodiment 3

In Preferred Embodiment 2 of the present invention, the capacitor C1A is provided preferably by laminating three kinds of ceramic green sheets 3c to 3d including different electrode patterns provided thereon, as shown in FIGS. 7A to 7F. In Preferred Embodiment 3 of the present invention, the number of kinds of electrode patterns is reduced, and a capacitor is provided by laminating two kinds of ceramic green sheets including different electrode patterns provided thereon. FIGS. 8A to 8E are exploded plan views showing a configuration of a capacitor C1B according to Preferred Embodiment 3 of the present invention. Referring to FIGS. 8A to 8E, an electrode pattern is formed by applying an electroconductive paste (for example, Ni paste) on barium titanate based ceramic green sheets 3g to 3k by the screen printing method. Here, in the capacitor C1B shown in FIGS. 8A to 8E, detailed description will not be repeated by denoting the elements similar to those of the capacitor C1A according to Preferred Embodiment 2 with the same reference symbols.

Figure 8A:
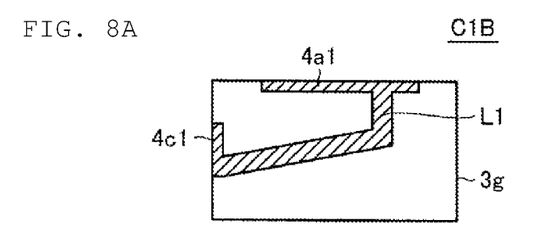
FIGS. 8A to 8E are exploded plan views showing a configuration of an essential portion of the capacitor according to Preferred Embodiment 3 of the present invention.
Figure 8B:
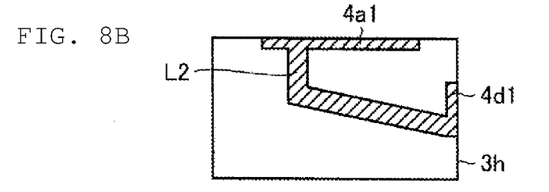

An angle defined by the interconnect pattern of the oblique line portion of the inductor L1 provided on the ceramic green sheet 3g shown in FIG. 8A and the interconnect pattern of the oblique line portion of the inductor L2 provided on the ceramic green sheet 3h shown in FIG. 8B is other than a right angle, so that, even when a stacking shift is generated in the ceramic green sheet 3 due to variation in production, the influence on the negative inductance component for canceling the parasitic inductance of the capacitor C1 is small. Here, in order to provide the inductors L1, L2, the ceramic green sheets 3a, 3b shown in FIGS. 7A to 7F may be used as well.

Figure 8C:
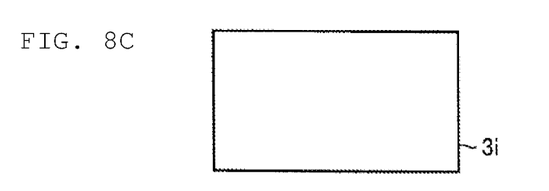

On the ceramic green sheet 3i shown in FIG. 8C, electrode patterns such as the internal electrode patterns 4a1, 4b1 and the internal electrode patterns 4c1, 4d1 are not provided. In other words, the ceramic green sheet 3i has a configuration for providing a dummy layer to provide a gap between the layer on which the inductors L1, L2 are provided and the layer on which the capacitor is provided. When the inductors L1, L2 and the electrode of the capacitor are located close to one another, the Q value of the inductors L1, L2 decreases by receiving an influence of the electrode of the capacitor. Accordingly, a decrease in the Q value is reduced or prevented by providing a dummy layer with the ceramic green sheet 3i.

Figure 8D:
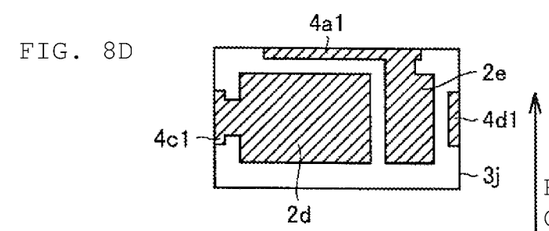

On the ceramic green sheet 3j shown in FIG. 8D, an internal electrode pattern 4a1 connected to the external electrode 4a and internal electrode patterns 4c1, 4d1 respectively connected to the external electrodes 4c, 4d are provided. Further, on the ceramic green sheet 3j, a planar electrode pattern 2d having a planar shape and connected to the internal electrode pattern 4c1 is provided so as to define one electrode of the capacitor C3, and a planar electrode pattern 2e having a planar shape and connected to the internal electrode pattern 4a1 is provided so as to define one electrode of the capacitor C1. In other words, in the electrode pattern provided on the ceramic green sheet 3j, the planar electrode pattern 2a provided on the ceramic green sheet 3c, and the planar electrode pattern 2c provided on the ceramic green sheet 3e shown in FIGS. 7A to 7F are provided. Thus, two electrode patterns are provided by separating the regions within one sheet of the ceramic green sheet 3j.

Figure 8E:
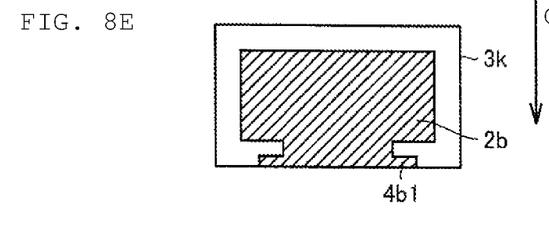

On the ceramic green sheet 3k shown in FIG. 8E, the internal electrode pattern 4b1 connected to the external electrode 4b is provided. Further, on the ceramic green sheet 3k, a planar electrode pattern 2b having a planar shape and connected to the internal electrode pattern 4b1 is provided so as to define the other electrodes of the capacitors C1, C3. The capacitances required in the capacitors C1, C3 are provided by repetitively laminating (for example, 200 layers) the ceramic green sheets 3j, 3k.

The plurality of ceramic green sheets 3g to 3k shown in FIGS. 8A to 8E are laminated, and a plurality of layers (for example, 25 layers) of ceramic green sheets (dummy layers) on which no internal electrode pattern is printed are laminated on each of the upper and lower surfaces thereof. An unfired laminate is provided by press-bonding the plurality of ceramic green sheets 3g to 3k including the dummy layers. The laminate is split into a large number of capacitors C1B by a method, such as dicing, for example. The laminate obtained by splitting is fired, and a copper electrode is fired and attached to the outside of the fired laminate so as to provide electrical connection to the internal electrode patterns 4a1, 4b1, thus forming the external electrodes 4a, 4b. Further, a copper electrode is fired and attached to the side surfaces of the fired laminate so as to provide electrical connection to the internal electrode patterns 4c1, 4d1, thus forming the external electrodes 4c, 4d.

The capacitance of the capacitor C1 and the capacitance of the capacitor C3 is able to be adjusted by selecting the area ratio between the planar electrode pattern 2d and the planar electrode pattern 2e that are provided within one sheet of the ceramic green sheet 3j. For example, when the area ratio is set to be 1:1 or about 1:1, the capacitance of the capacitor C1 and the capacitance of the capacitor C3 will be equal or substantially equal to each other. The area ratio between the planar electrode pattern 2d and the planar electrode pattern 2e may be adjusted so that the ratio of the capacitance of the capacitor C3 to the capacitance of the capacitor C1 will preferably be equal to or larger than 7:3 or about 7:3, as described in Preferred Embodiment 1. Here, in the capacitor C1B, the area ratio between the planar electrode pattern 2d and the planar electrode pattern 2e may be adjusted so that the capacitance of the capacitor C3 will preferably be equal to or larger than the capacitance of the capacitor C1.

As described above, the capacitor C1B according to the present preferred embodiment is able to cancel the parasitic inductance (inductor L4) of the capacitor C1 and maintain the charge supplying performance to the electronic component even when the number of kinds of electrode patterns provided on the ceramic green sheet 3 is reduced.

Here, even in the capacitor C1B according to the present preferred embodiment, a capacitor may be provided between the external electrode 4d defining an input terminal and the external electrode 4b. Also, by providing different capacitances between the capacitor C3 provided between the external electrode 4c and the external electrode 4b and the capacitor provided between the external electrode 4d and the external electrode 4b, the charge supplying performance to the electronic component may be made to differ by selecting whether the external electrode 4c is used as the output terminal or the external electrode 4d is used as the output terminal. Further, even in the capacitor C1B according to the present preferred embodiment, the same or substantially the same configuration as in the inductors L1, L2 described in Preferred Embodiment 1 may be provided.

Preferred Embodiment 4

Figure 9:
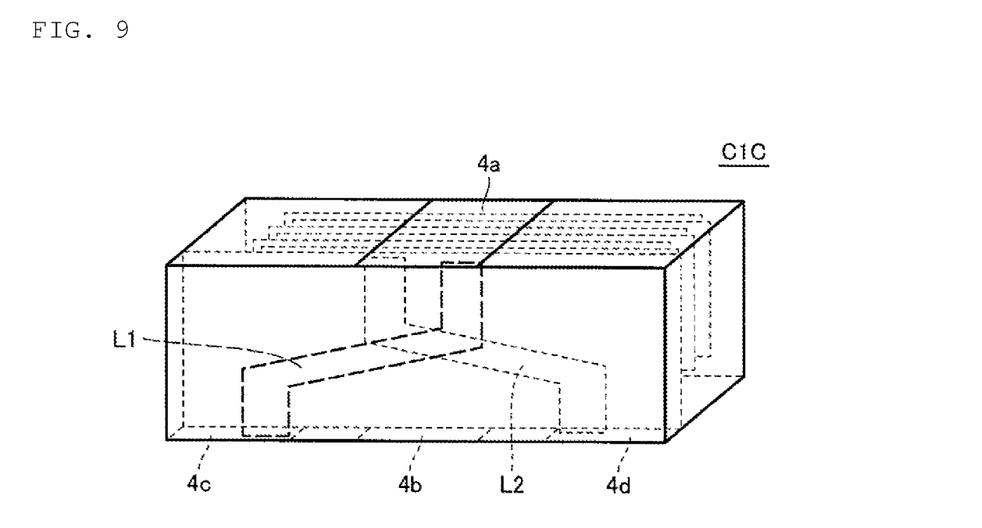
FIG. 9 is a perspective view of a capacitor according to Preferred Embodiment 4 of the present invention.

Referring to FIG. 5, in Preferred Embodiment 2 of the present invention, description has been provided of the capacitor C1A in which the plurality of dielectric ceramic layers are laminated in the vertical direction as viewed in the drawing. However, the direction in which the dielectric ceramic layers are laminated is not limited to the vertical direction. Accordingly, in Preferred Embodiment 4 of the present invention, description will be provided of a capacitor in which a plurality of dielectric ceramic layers are laminated in the horizontal direction. FIG. 9 is a perspective view of a capacitor according to Preferred Embodiment 4 of the present invention.

A capacitor C1C shown in FIG. 9 is a multilayer ceramic capacitor in which a plurality of internal electrodes and dielectric ceramic layers for obtaining electrostatic capacitance are alternately laminated in the horizontal direction as viewed in the drawing. The laminated internal electrodes are extended alternately at one end and at the other end of the capacitor C1C. The internal electrodes extended to the respective ends are connected to external electrodes 4a, 4b disposed at the respective ends of the capacitor C1C. Further, in the capacitor C1C, inductors L1, L2 are provided in the inside in order to cancel the parasitic inductance, and also the capacitor C3 is provided in the inside in order to supply electric charge. Here, in the capacitor C1C shown in FIG. 9, detailed description will not be repeated by denoting the elements similar to those of the capacitor C1A according to Preferred Embodiment 2 with the same reference symbols. Also, since the equivalent circuit of the capacitor C1C is the same or substantially the same as the equivalent circuit of the capacitor C1A according to Preferred Embodiment 2 shown in FIG. 6, detailed description will not be repeated.

The inductors L1, L2 are provided on a left layer side of the capacitor C1C as viewed in the drawing and are provided on the left side of the dielectric ceramic layer in which the capacitor C1 is provided. The inductor L1 is an interconnect pattern that is connected to the external electrode 4a to extend to the external electrode 4c. The inductor L2 is an interconnect pattern that is connected to the external electrode 4a in the same or substantially the same manner as the inductor L1 to extend to the external electrode 4d and crosses over the inductor L1. The external electrode 4d is provided on the lower surface of the capacitor C1C as viewed in the drawing in the same or substantially the same manner as the external electrode 4c. However, the external electrode 4d is provided on a side opposite to the external electrode 4c in the longitudinal direction of the capacitor C1C. Also, the external electrode 4b is provided on the lower surface of the capacitor C1C as viewed in the drawing in the same or substantially the same manner as the external electrodes 4c, 4d. However, the external electrode 4b is provided between the external electrode 4c and the external electrode 4d. Here, as will be described later, in the capacitor C1C, the capacitor C3 is provided on a right layer side as viewed in the drawing, and the capacitor C3 is provided on the right side of the dielectric ceramic layer in which the capacitor C1 is provided.

Figure 10:
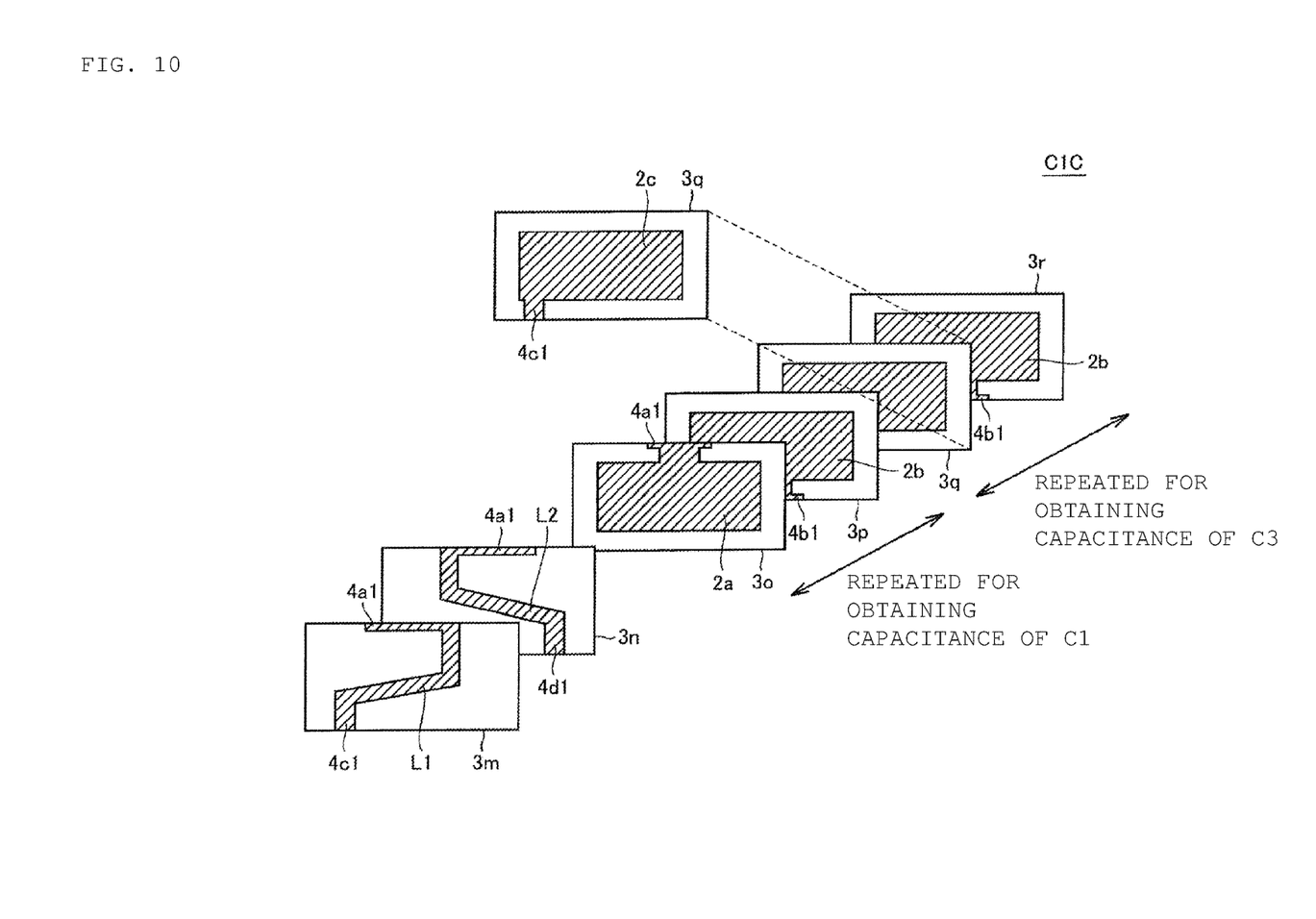
FIG. 10 is an exploded perspective view showing a configuration of an essential portion of the capacitor according to Preferred Embodiment 4 of the present invention.

FIG. 10 is an exploded perspective view showing a configuration of an essential portion of the capacitor C1C according to Preferred Embodiment 4 of the present invention. Referring to FIG. 10, an electrode pattern is formed by applying an electroconductive paste (for example, Ni paste) on barium titanate based ceramic green sheets 3m to 3r by the screen printing method. On the ceramic green sheet 3m which is the first sheet as viewed from the left side in the drawing, internal electrode patterns 4a1, 4c1 connected respectively to the external electrodes 4a, 4c are provided. Further, on the ceramic green sheet 3m, an internal electrode pattern having an interconnect shape that connects the internal electrode pattern 4a1 and the internal electrode pattern 4c1 is provided so as to define the inductor L1.

On the ceramic green sheet 3n which is the second sheet as viewed from the left side in the drawing, internal electrode patterns 4a1, 4d1 connected respectively to the external electrodes 4a, 4d are provided. Further, on the ceramic green sheet 3n, an internal electrode pattern having an interconnect shape that connects the internal electrode pattern 4a1 and the internal electrode pattern 4d1 is provided so as to define the inductor L2. The ceramic green sheets 3m, 3n define the first functional portion of the inductors L1, L2.

On the ceramic green sheet 3o which is the third sheet as viewed from the left side in the drawing, an internal electrode pattern 4a1 connected to the external electrode 4a is provided. Further, on the ceramic green sheet 3o, a planar electrode pattern 2a having a planar shape and connected to the internal electrode pattern 4a1 is provided so as to define one electrode of the capacitor C1.

On the ceramic green sheet 3p which is the fourth sheet as viewed from the left side in the drawing, an internal electrode pattern 4b1 connected to the external electrode 4b is provided. Further, on the ceramic green sheet 3p, a planar electrode pattern 2b having a planar shape and connected to the internal electrode pattern 4b1 is provided so as to define the other electrode of the capacitor C1. The capacitance required in the capacitor C1 is provided by repetitively laminating (for example, 100 layers) the ceramic green sheets 3o, 3p. The ceramic green sheets 3o, 3p define the second functional portion of the capacitor C1.

On the ceramic green sheet 3q which is the fifth sheet as viewed from the left side in the drawing, an internal electrode pattern 4c1 connected to the external electrode 4c is provided. Further, on the ceramic green sheet 3q, a planar electrode pattern 2c having a planar shape and connected to the internal electrode pattern 4c1 is provided so as to define one electrode of the capacitor C3. Here, in FIG. 10, the ceramic green sheet 3q is illustrated by being drawn out besides the ceramic green sheet 3q illustrated by being lined up with the other ceramic green sheets, in order to illustrate the external electrode 4c to which the internal electrode pattern 4c1 is connected.

On the ceramic green sheet 3r which is the sixth sheet as viewed from the left side in the drawing, an internal electrode pattern 4b1 connected to the external electrode 4b is provided. Further, on the ceramic green sheet 3r, a planar electrode pattern 2b having a planar shape and connected to the internal electrode pattern 4b1 is provided so as to define the other electrode of the capacitor C3. The capacitance required in the capacitor C3 is provided by repetitively laminating (for example, 200 layers) the ceramic green sheets 3q, 3r. The ceramic green sheets 3q, 3r define the third functional portion of the capacitor C3.

The plurality of ceramic green sheets 3m to 3r shown in FIG. 10 are laminated, and a plurality of layers (for example, 25 layers) of ceramic green sheets (dummy layers) on which no internal electrode pattern is printed are laminated on each of the right and left surfaces thereof. An unfired laminate is provided by press-bonding the plurality of ceramic green sheets 3 including the dummy layers. The laminate is split into a large number of capacitors C1C by a method, such as dicing, for example. The laminate obtained by splitting is fired, and a copper electrode is fired and attached to the upper surface of the fired laminate so as to provide electrical connection to the internal electrode pattern 4a1, thus forming the external electrode 4a. Further, a copper electrode is fired and attached to the lower surface of the fired laminate so as to provide electrical connection to the internal electrode patterns 4b1 to 4d1, thus forming the external electrodes 4b to 4d.

The capacitance of the capacitor C1 and the capacitance of the capacitor C3 may be adjusted by selecting the number of ceramic green sheets 3o to 3r to be horizontally laminated. For example, when the same number of ceramic green sheets are laminated, the capacitance of the capacitor C1 and the capacitance of the capacitor C3 will be equal or substantially equal to each other. The number of ceramic green sheets 3o to 3r to be horizontally laminated may be adjusted so that the ratio of the capacitance of the capacitor C3 to the capacitance of the capacitor C1 will preferably be equal to or larger than 7:3 or about 7:3, as described in Preferred Embodiment 1. Here, in the capacitor C1C, the number of ceramic green sheets 3o to 3r to be horizontally laminated may preferably be adjusted so that the capacitance of the capacitor C3 will be equal to or larger than the capacitance of the capacitor C1.

As described above, the capacitor C1C according to the present preferred embodiment is a capacitor in which a plurality of dielectric ceramic layers are horizontally laminated, and includes the first functional portion, the second functional portion, and the third functional portion, so that the capacitor C1C is able to cancel the parasitic inductance (inductor L4) of the capacitor C1 and maintain the charge supplying performance to the electronic component.

Here, in the capacitor C1C according to the present preferred embodiment, a capacitor may be provided between the external electrode 4d defining an input terminal and the external electrode 4b. Also, by providing different capacitances between the capacitor C3 provided between the external electrode 4c and the external electrode 4b and the capacitor provided between the external electrode 4d and the external electrode 4b, the charge supplying performance to the electronic component may be made to differ by selecting whether the external electrode 4c is used as the output terminal or the external electrode 4d is used as the output terminal. Furthermore, in the capacitor C1C according to the present preferred embodiment, the inductors L1, L2 are provided on the left layer side, and the capacitor C3 is provided on the right layer side. Accordingly, the capacitor C3 is not significantly affected by the inductors L1, L2, and delay of the electric charge that is supplied to the electronic component connected to the output terminal is able to be reduced or prevented. Also, in the capacitor C1C according to the present preferred embodiment, the same or substantially the same configuration as in the inductors L1, L2 described in Preferred Embodiment 1 may be provided. Furthermore, in the capacitor C1C according to the present preferred embodiment, the number of kinds of electrode patterns provided on the ceramic green sheets 3o to 3r may be reduced as in the capacitor C1B according to Preferred Embodiment 3.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit substrate on which a capacitance element is to be mounted, the circuit substrate comprising:
    a first electrode connected to one terminal of the capacitance element;
    a first inductance element including a first interconnect that extends from a first end connected to the first electrode to a second end across a region in which the capacitance element is to be mounted;
    a second inductance element including a second interconnect that extends from a first end connected to the first electrode to a second end across the region in which the capacitance element is to be mounted from a side opposite to the first interconnect;
    an input terminal connected to the second end of the second interconnect;
    an output terminal connected to the second end of the first interconnect; and
    a second electrode that provides a capacitance between the output terminal and the second electrode; wherein
    the capacitance provided by the output terminal and the second electrode is equal to or larger than a capacitance of the capacitance element.

2. The circuit substrate according to claim 1, wherein a shape of the first inductance element and a shape of the second inductance element are the same or substantially the same and line-symmetric with respect to the first electrode.

3. The circuit substrate according to claim 1, wherein, in a plan view, the first interconnect and the second interconnect intersect with each other, and an angle between the first interconnect and the second interconnect is other than a right angle.

4. The circuit substrate according to claim 1, wherein a ratio of the capacitance provided by the output terminal and the second electrode to the capacitance of the capacitance element is equal to or larger than about 7:3.

5. The circuit substrate according to claim 1, further comprising:
    a third electrode that provides a capacitance between the input terminal and the third electrode; wherein the capacitance provided by the input terminal and the third electrode is equal or substantially equal to the capacitance provided by the output terminal and the second electrode.

6. The circuit substrate according to claim 1, wherein the circuit substrate is a multilayer substrate including a plurality of layers.

7. The circuit substrate according to claim 6, wherein the plurality of layers are made of a glass epoxy.

8. A filter circuit comprising:
the circuit substrate according to claim 1; and
the capacitance element is defined by a capacitor that is mounted on the circuit substrate.

9. The filter circuit according to claim 8, wherein a shape of the first inductance element and a shape of the second inductance element are the same or substantially the same and line-symmetric with respect to the first electrode.

10. The filter circuit according to claim 8, wherein, in a plan view, the first interconnect and the second interconnect intersect with each other, and an angle between the first interconnect and the second interconnect is other than a right angle.

11. The filter circuit according to claim 8, wherein a ratio of the capacitance provided by the output terminal and the second electrode to the capacitance of the capacitance element is equal to or larger than about 7:3.

12. The filter circuit according to claim 8, further comprising:
a third electrode that provides a capacitance between the input terminal and the third electrode; wherein
the capacitance provided by the input terminal and the third electrode is equal or substantially equal to the capacitance provided by the output terminal and the second electrode.

13. The filter circuit according to claim 8, wherein the circuit substrate is a multilayer substrate including a plurality of layers.

14. The filter circuit according to claim 13, wherein the plurality of layers are made of a glass epoxy.

15. The filter circuit according to claim 8, wherein the capacitor is a multilayer ceramic capacitor.

16. The filter circuit according to claim 15, wherein the multilayer ceramic capacitor includes $BaTiO_3$ as a major component.

17. A capacitance element comprising:
a ceramic element body including a plurality of laminated ceramic layers, a pair of main surfaces that oppose each other, and side surfaces that connect the pair of main surfaces;
a plurality of internal electrodes disposed in an inside of the ceramic element body; and
a plurality of external electrodes disposed on the side surfaces of the ceramic element body and respectively electrically connected to the plurality of internal electrodes; wherein
the plurality of internal electrodes include:
a first internal electrode disposed on a first side surface of the ceramic element body;
a second internal electrode disposed on a second side surface of the ceramic element body, the second side surface opposing the first side surface;
a third internal electrode disposed on a third side surface of the ceramic element body, the third side surface not opposing the first side surface; and
a fourth internal electrode disposed on a fourth side surface of the ceramic element body, the fourth side surface opposing the third side surface;
the ceramic element body includes a first functional portion, a second functional portion, and a third functional portion that are disposed along a height direction connecting between the pair of main surfaces that oppose each other;
the first functional portion includes:
a first inductance element including a first interconnect that extends from one end connected to the first internal electrode to the third internal electrode; and
a second inductance element including a second interconnect that extends from one end connected to the first internal electrode to the fourth internal electrode and crosses over the first interconnect;
the second functional portion includes:
a first planar electrode connected to the first internal electrode; and
a second planar electrode connected to the second internal electrode;
the third functional portion includes:
the second planar electrode; and
a third planar electrode connected to the third internal electrode; and
a capacitance provided in the third functional portion is equal to or larger than a capacitance provided in the second functional portion.

18. The capacitance element according to claim 17, wherein the plurality of internal electrodes are made of an electroconductive Ni paste.

19. The capacitance element according to claim 17, wherein the plurality of laminated ceramic layers are made of $BaTiO_3$.

20. The capacitance element according to claim 17, wherein a thickness of each of the plurality of internal electrodes is about 3 μm.

* * * * *